US011201280B2

(12) United States Patent
Zhou et al.

(10) Patent No.: US 11,201,280 B2
(45) Date of Patent: Dec. 14, 2021

(54) BOTTOM LEADS CHEMICAL MECHANICAL PLANARIZATION FOR TMR MAGNETIC SENSORS (71) Applicant: Western Digital Technologies, Inc., San Jose, CA (US)

(72) Inventors: Ronghui Zhou, Fremont, CA (US); Ming Mao, Dublin, CA (US); Ming Jiang, San Jose, CA (US); Yuankai Zheng, Fremont, CA (US); Chen-jung Chien, Mountain View, CA (US); Yung-Hung Wang, San Jose, CA (US); Chih-Ching Hu, Pleasanton, CA (US)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 100 days.

(21) Appl. No.: 16/730,771

(22) Filed: Dec. 30, 2019

(65) Prior Publication Data
US 2021/0057638 A1   Feb. 25, 2021

Related U.S. Application Data (60) Provisional application No. 62/891,154, filed on Aug. 23, 2019.

(51) Int. Cl.
G11B 5/39     (2006.01)
H01L 43/12    (2006.01)
(Continued)

(52) U.S. Cl.
CPC ............ H01L 43/02 (2013.01); G01R 17/105 (2013.01); G01R 33/093 (2013.01);
(Continued)

(58) Field of Classification Search
None
See application file for complete search history.

(56) References Cited

U.S. PATENT DOCUMENTS 6,490,139 B1 * 12/2002 Hayashi .......... B82Y 25/00
                                              360/322
9,570,676 B2   2/2017 Kolb et al.
(Continued)

FOREIGN PATENT DOCUMENTS

| CN | 107785483 A | 3/2018 |
| EP | 2804230 A1 | 11/2014 |
| EP | 3525252 A1 | 8/2019 |

OTHER PUBLICATIONS

Ferreira, Ricardo et al.; "2-Axis Magnetometers Based on Full Wheatstone Bridges Incorporating Magnetic Tunnel Junctions Connected in Series" IEEE Transactions on Magnetics, vol. 48, No. Nov. 11, 2012 (4 pages).
(Continued)

Primary Examiner — Jefferson A Evans
(74) Attorney, Agent, or Firm — Patterson & Sheridan, LLP; Steven H. Versteeg (57) ABSTRACT A Wheatstone bridge array comprising a tunneling magnetoresistive (TMR) sensor and a method for manufacturing is disclosed. The bottom lead for the TMR sensor has a very small surface roughness due to not only chemical mechanical planarization (CMP) but also due to forming the bottom lead from multiple layers. The multiple layers include at least a bottom first metal layer and a top second metal layer disposed on the first metal layer. The second metal layer generally has a lower surface roughness than the first metal layer. Additionally, the second metal layer has a slower polishing rate. Therefore, not only does the second metal layer reduce the surface roughness simply be being present, but the slower polishing rate enables the top second metal
(Continued)

film to be polished to a very fine surface roughness of less than or equal to ~2 Angstroms.

22 Claims, 6 Drawing Sheets

(51) Int. Cl.
    *H01L 43/02*     (2006.01)
    *G01R 17/10*     (2006.01)
    *G01R 33/09*     (2006.01)
    *H01L 43/08*     (2006.01)
    *H01L 43/10*     (2006.01)

(52) U.S. Cl.
    CPC ............. *G01R 33/098* (2013.01); *G11B 5/39* (2013.01); *G11B 5/3909* (2013.01); *H01L 43/08* (2013.01); *H01L 43/10* (2013.01); *H01L 43/12* (2013.01)

(56) References Cited

U.S. PATENT DOCUMENTS

| | | | |
|---|---|---|---|
| 9,591,221 | B2 | 3/2017 | Miller et al. |
| RE46,428 | E | 6/2017 | Mather et al. |
| 9,684,184 | B2 | 6/2017 | Miller et al. |
| 9,817,084 | B2 | 11/2017 | Deak |
| 10,270,028 | B1* | 4/2019 | Tien ........................ H01L 43/08 |
| 2004/0115839 | A1* | 6/2004 | Sugita ................. H01F 10/3268 438/3 |
| 2005/0006682 | A1* | 1/2005 | Bae ........................ B82Y 10/00 257/295 |
| 2009/0257154 | A1 | 10/2009 | Carey et al. |
| 2012/0068698 | A1 | 3/2012 | Chen et al. |
| 2012/0104352 | A1* | 5/2012 | Aoyama ................ H01L 27/101 257/5 |
| 2012/0135273 | A1 | 5/2012 | Horng et al. |
| 2017/0011757 | A1* | 1/2017 | Hashimoto .......... G11B 5/3906 |
| 2017/0097392 | A9 | 4/2017 | Litvinov et al. |
| 2017/0279036 | A1* | 9/2017 | Mo ........................ H01L 43/02 |
| 2018/0108831 | A1* | 4/2018 | Xue ........................ H01L 43/12 |
| 2019/0020822 | A1 | 1/2019 | Sharma et al. |
| 2019/0245141 | A1* | 8/2019 | Yang ........................ H01L 43/08 |
| 2019/0341542 | A1* | 11/2019 | Haq ........................ G11B 5/6082 |
| 2021/0066578 | A1* | 3/2021 | Doris ........................ H01L 43/02 |
| 2021/0104660 | A1* | 4/2021 | Dutta ........................ H01L 43/02 |
| 2021/0134882 | A1* | 5/2021 | Lin ........................ H01L 43/08 |

OTHER PUBLICATIONS

Lopes, Antonio; "MgO Magnetic Tunnel Junction Sensors in Full Wheatstone Bridge Configuration for Electrical Current Detention"; https://fenix.tecnico.ulisboa.pt/downloadFile/395144787699/resumo.pdf; Oct. 15, 2012 (8 pages).

International Search Report issued in corresponding International Patent Application No. PCT/US2020/025871, dated Jul. 21, 2020 (10 pages).

* cited by examiner

BOTTOM LEADS CHEMICAL MECHANICAL PLANARIZATION FOR TMR MAGNETIC SENSORS

CROSS-REFERENCE TO RELATED APPLICATIONS

This application claims benefit of U.S. Provisional Patent Application Ser. No. 62/891,154, filed Aug. 23, 2019, which is herein incorporated by reference.

BACKGROUND OF THE DISCLOSURE

Field of the Disclosure

Embodiments of the present disclosure generally relate to a Wheatstone bridge array and a method of manufacture thereof.

Description of the Related Art

A Wheatstone bridge is an electrical circuit used to measure an unknown electrical resistance by balancing two legs of a bridge circuit, one leg of which includes an unknown component. The Wheatstone circuit provides extremely accurate measurements in comparison to a simple voltage divider.

The Wheatstone bridge includes multiple resistors that, especially recently, include magnetic material such as a magnetic sensors. Magnetic sensors can include Hall effect magnetic sensors, anisotropy magnetoresistive sensors (AMR), giant magnetoresistive (GMR) sensors, and tunneling magnetoresistive (TMR) sensors. The TMR sensor has a very high sensitivity compared to other magnetic sensors.

The reliability and performance of TMR sensors determine the magnetoresistance response. Various factors impact the reliability and performance of TMR sensors such as the materials of the TMR sensor, and, more importantly the method of fabricating the TMR sensor. For example, while the exact same materials may be used to fabricate two different TMR sensors, the TMR sensors will have different reliability and performance due to the different fabrication processes.

Therefore, there is a need in the art for a TMR sensor, and method of fabricating thereof, that delivers good reliability and performance.

SUMMARY OF THE DISCLOSURE

A Wheatstone bridge array comprising a tunneling magnetoresistive (TMR) sensor and a method for manufacturing is disclosed. The bottom lead for the TMR sensor has a very small surface roughness due to not only chemical mechanical planarization (CMP) but also due to forming the bottom lead from multiple layers. The multiple layers include at least a bottom first metal layer and a top second metal layer disposed on the first metal layer. The second metal layer generally has a lower surface roughness than the first metal layer. Additionally, the second metal layer has a slower polishing rate. Therefore, not only does the second metal layer reduce the surface roughness simply be being present, but the slower polishing rate enables the top second metal film to be polished to a very fine surface roughness of less than or equal to ~2 Angstroms.

In one embodiment, a TMR sensor device comprises a substrate; a bottom lead disposed over the substrate, the bottom lead formed by a CMP process; a TMR sensor stack coupled to the bottom lead; and a top lead coupled to the TMR sensor stack.

In another embodiment, a method of fabricating a TMR sensor device comprises forming a bottom lead over a substrate, wherein the forming includes: depositing a first conductive material over a substrate; depositing a second conductive material on the first conductive material, wherein the first conductive material and the second conductive material are different; depositing a photoresist layer over the bottom lead; selectively removing a portion of the bottom lead; depositing an electrically insulating material adjacent remaining bottom lead; depositing a CMP stop layer on the electrically insulating material; performing a CMP process on the bottom lead; forming a TMR sensor stack over the bottom lead; and forming a top lead over the TMR sensor stack.

In another embodiment, a method for manufacturing a bottom lead comprises depositing alternating layers of conductive material onto a substrate to create a bottom lead stack; depositing a layer of a CMP-inert metal film on top of the bottom lead stack; depositing an outer insulating material around the bottom lead stack; depositing a CMP stopper layer on top of the outer insulating material; and performing a CMP process on the CMP-inert metal film using a polishing slurry.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

A Wheatstone bridge array comprising a tunneling magnetoresistive (TMR) sensor and a method for manufacturing is disclosed. The bottom lead for the TMR sensor has a very small surface roughness due to not only chemical mechanical planarization (CMP) but also due to forming the bottom lead from multiple layers. The multiple layers include at least a bottom first metal layer and a top second metal layer disposed on the first metal layer. The second metal layer generally has a lower surface roughness than the first metal layer. Additionally, the second metal layer has a slower polishing rate. Therefore, not only does the second metal layer reduce the surface roughness simply be being present, but the slower polishing rate enables the top second metal film to be polished to a very fine surface roughness of less than or equal to ~2 Angstroms.

Figure 1:
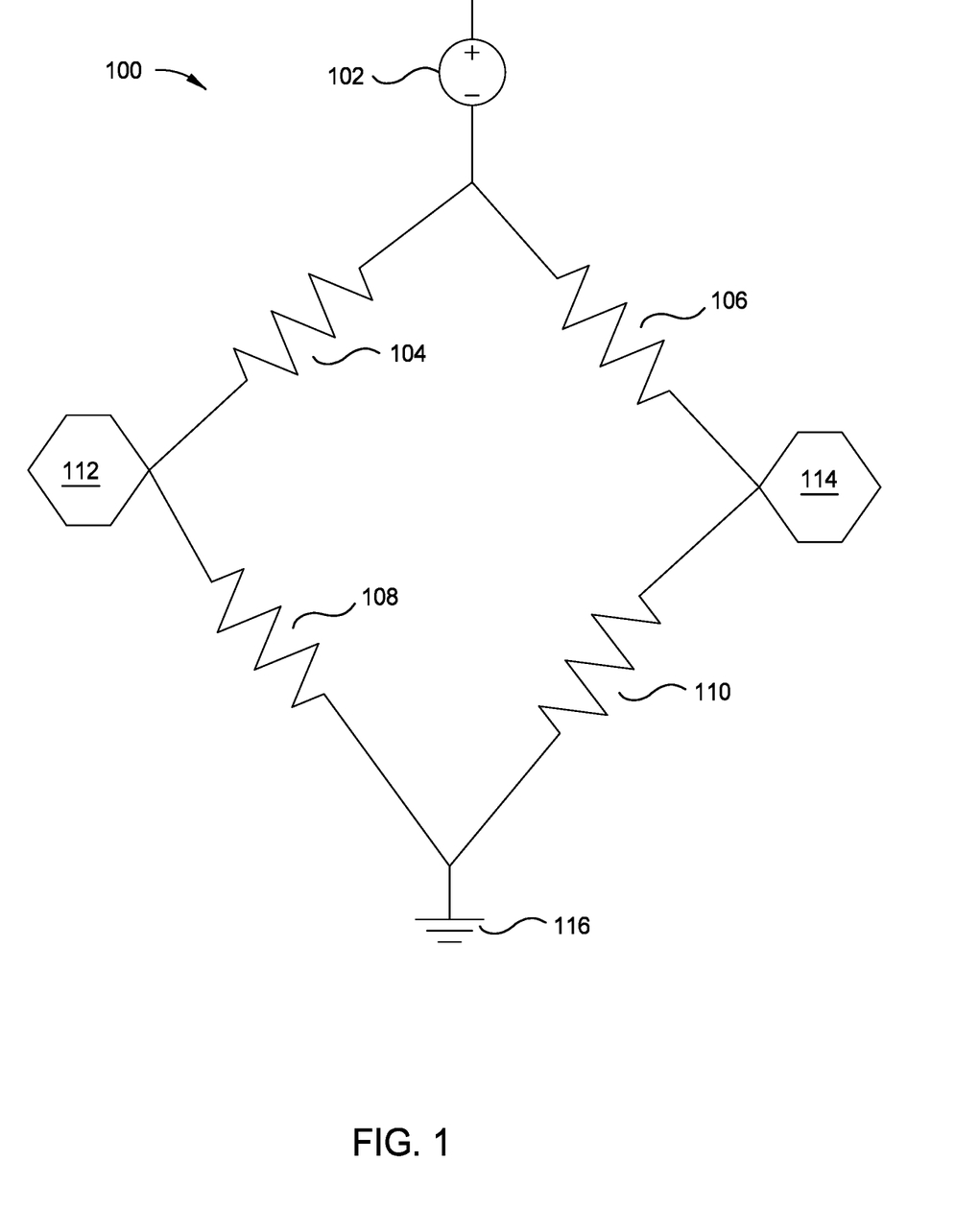
FIG. 1 is a schematic illustration of a Wheatstone bridge array design.

FIG. 1 is a schematic illustration of a Wheatstone bridge array 100 design. The array 100 includes a bias source 102, a first resistor 104, a second resistor 106, a third resistor 108, a fourth resistor 110, a first sensor output pad 112, a second sensor output pad 114, and a ground connection 116. Bias voltage is applied across the array from the bias source 102 to the ground connection 116. The first sensor output pad 112 and the second sensor output pad 114 sense the output of the applied voltage. Any temperature change from the resistors 104, 106, 108, 110 can be cancelled.

As discussed herein, the resistors 104, 106, 108, 110 each include a TMR sensor. In one embodiment, the TMR sensors are each distinct and different such that the resistors 104, 106, 108, 110 have different resistance. In another embodiment, the TMR sensors are identical, but the resistors 104, 106, 108, 110 are different. In still another embodiment, resistors 104, 110 are identical to each other (as are the TMR sensors that comprise the resistors 104, 110), and resistors 106, 108 are identical to each other (as are the TMR sensors that comprise the resistors 106, 108) yet different from resistors 104, 110. For a TMR sensor in array 100, the RA for the array 100 is around 100 Ohms microns$^2$.

Typical magnetic field sensors use MR (magnetoresistance) devices in a Wheatstone bridge circuit. The sensor requires the MR devices to change differently in the bridge. As discussed herein, a new method to make a magnetic field sensor is to fabricate two different TMR films in the same layer. The reliability and performance of the TMR films determines the magnetoresistance response. The TMR films are fabricated upon a flat and smooth surface by implementing a bottom layer CMP process. The new method considers the different polishing mechanisms to achieve ~2 A roughness and minimum 2-4 nm thickness variance. TMR films fabricated upon the ultra-smooth surface have a 40% improved performance and magnetoresistance response. In this way, combined with different TMR films features, a perfect Wheatstone bridge design for magnetic field sensor can be fabricated.

In regards to FIG. 1, if the free layer of the TMR sensors that comprises the resistors 104, 106, 108, 110 has a long axis of +45° or −45° to the pinned layer magnetization direction, then the free layer easy axis is restricted to be along the long axis due to the shape anisotropy, and the magnetization direction can be set as shown in the cartoon by an ampere field from the set line current, especially if on top of the free layer there is a set line orthogonal to the free layer long axis.

When applying a magnetic field along Y-axis, resistors 110 and 104 are increasing while resistors 106, 108 are decreasing with the field. This different response enables the Wheatstone bridge, and the sensor sensitivity is proportional to the output voltage which is proportional to the difference between resistor 110 (or resistor 104) and resistor 106 (or resistor 108). However, in only use half of the magnetoresistance change is used due to the 45° free layer or pinned layer initial state. If the free layer to pinned layer initial state can be 90° and still have two different magnetoresistance change, the sensor sensitivity can be increased by a factor of two.

If the free layer and pinned layer are orthogonal, then the pinned layer magnetization direction is set by magnetic annealing direction. Usually resistors 104, 106, 108, 110 are made by the same TMR film and experience the same processes, and therefore all have the same pinned layer direction. Each device can operate in full MR ratio, but all the devices respond to the external field in the same way and consequently there is no output voltage at all. A simple way to resolve this issue is to shield resistor 106 and resistor 108 by covering with a thick NiFe film so that resistor 106 and resistor 108 will not respond to magnetic fields. Alternatively, resistors 106 and 108 can be replaced with constant resistors. However, this kind of half bridge-sensing scheme will also reduce the output voltage and therefore limits the sensitivity.

As discussed herein, a new CMP process provides an ultra-smooth surface to make a magnetic field sensor with two different TMR films in the same layer. The two different TMR films provide two different magnetoresistance responses. Furthermore, both TMR films having free layer and pinned layer magnetic moments orthogonal to each other but the magnetoresistance responses are reversed, i.e., one TMR resistance is increasing while the other TMR resistance is decreasing linearly with the external magnetic field. In this way, a perfect Wheatstone bridge design for magnetic field sensor is manufactured.

In order to achieve the maximum performance of the two different TMR films in the same layer, an important key factor is to provide an ultra-smooth surface at the bottom lead (BL). However, the BL usually accumulates a surface roughness ~10-20A after plating and deposition process. A wavy bottom lead surface is not desired and affects the sensitivity of TMR films.

Figure 2:
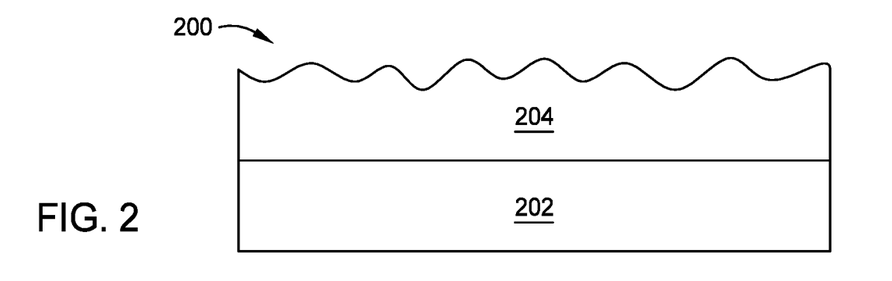
FIG. 2 is a schematic illustration of a bottom lead for a TMR sensor of a Wheatstone bridge array.

FIG. 2 is a schematic illustration of a BL 200 for a TMR sensor of a Wheatstone bridge array 100. The BL 200 includes a substrate 202 as well as the electrode material 204. In one embodiment, the substrate 202 comprises an insulating material such as aluminum oxide. It is to be understood that while aluminum oxide is discussed as the insulating material, other insulating materials are contemplated. Furthermore, the substrate 202 is not limited to a single layer, but rather, could encompass multiple layers of a CMOS device. The electrode material 204 is a conductive material. One suitable conductive material that may be used is copper. Copper tends to be easily deposited by both electroplating and electroless plating. However, copper tends to be deposited granularly and thus has a surface roughness that can be between about 10 Angstroms to about 20 Angstroms and shown as a roughened surface in FIG. 2.

A special BL CMP process, with minimum metal removal yet achieves surface roughness reduction purpose is beneficial in the two TMR films magnetic sensor fabrication. FIGS. 3A-3G are schematic illustrations of a BL 300 for a TMR sensor of a Wheatstone bridge array 100 according to one embodiment. In this process flow, BL films stacks (Typical BL stacks: Ta/Cu/Ta/Cu/Ta) are deposited or plated as full film metals. A CMP-inert metal film (10-15 nm Ta) is deposited upon BL stacks. When copper is used, copper has a much higher polish rate and cannot be used to control final BL stack's thickness within the nm level. It is contemplated that tantalum be used over the copper. Tantalum has a slower polish rate compared with BL stacks materials (e.g., copper) and can ensure the BL stack's thickness. However, a 10-15 nm Ta film is extremely thin for typical polishing processes. Consequently, a photo patterning can define BL dimensions and replace the field metal materials with dielectric materials. As will be discussed below, a thin SiOx is deposited as CMP stopper layer. CMP roughness correction is performed and the SiOx CMP stopper layer is removed afterwards for downstream TMR film deposition. The CMP process discussed herein is beneficial due to the strict surface roughness requirements (i.e., ~2 Angstroms) and accurate thickness control (e.g., total removal amount <5 nm) to ensure BL stack's stability and sensitivity.

In operation, the choice of polishing slurry depends on several parameters including total removal amount, different materials selectivity, particle sizes and additive dispersion. Based on the requirement of minimum inert tantalum film removal to ensure thickness control, a customized slurry is chosen with a certain level of dilution (1:5~1:20). Suitable slurries that may be used includes slurries from the MH-series of slurries from Cabot. In one embodiment, a slurry includes Al2O3 based abrasive particles that is diluted to a ratio of 1:5, 1:10, or 1:20 to lower the removal rate. A cleaning surfactant can be added as well to disperse the abrasive particles and enhances the cleaning effect if desirable. In one embodiment, the pH of the slurry is neutral. Therefore, the customized slurry has a reduced tantalum film removal rate. To ensure the SiOx functions appropriately as a CMP stop, the customized slurry has a high selectivity between SiOx and AlOx so that SiOx stopper layer controls bulk thickness without being affected by polishing process. Particles sizes and additive dispersion both contribute to the final surface roughness. The smaller particle sizes, the smoother particles will have better final roughness. Additive dispersion performs the role to reduce particle agglomeration and improve final cleaning effects.

Combining the slurry choices and optimized polish conditions, the BL CMP process is above to remove 2-5 nm tantalum of the topmost tantalum layer and achieve ~2 Angstroms surface roughness for downstream TMR film deposition.

Figure 3A:
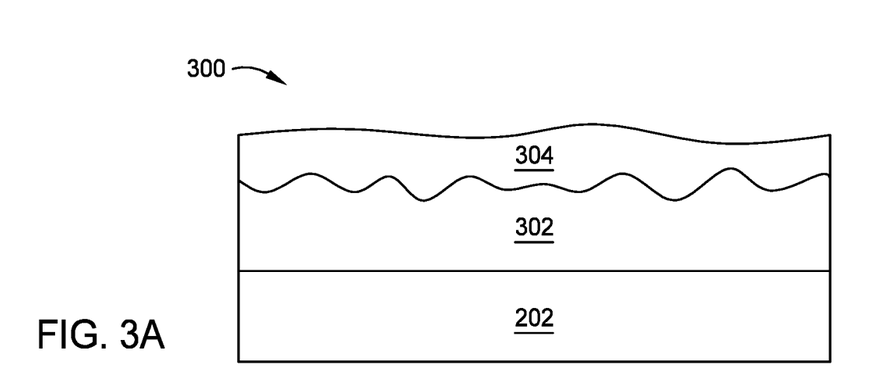
FIGS. 3A-3G are schematic illustrations of a bottom lead for a TMR sensor of a Wheatstone bridge array according to one embodiment.

As shown in FIG. 3A, a first conductive layer 302 is formed on the substrate 202. The first conductive layer 302 can comprise any conductive material that is considered a BL material. In one embodiment, the first conductive layer 302 comprises copper. The first conductive layer 302 has a surface roughness that is far greater than 2 Angstroms. The first conductive layer 302 may be deposited by well-known methods such as electroplating, electroless plating, and sputtering.

A second conductive layer 304 is deposited on the first conductive layer 302. The second conductive layer 304 is more amorphous than the first conductive layer 302 and thus, has less surface roughness than the first conductive layer 302. The second conductive layer 304 can be said to somewhat reset the surface roughness for a layer deposited thereover. Because the second conductive layer 304 is more amorphous than the first conductive layer 302, the surface roughness of the first conductive layer 302 does not completely translated through to the second conductive layer 304. The second conductive layer 304 does, however, have a surface roughness, but the surface roughness is less than the surface roughness of the first conductive layer 302. In one embodiment, the second conductive layer 304 comprises any conductive material that is considered a BL material. In another embodiment, the second conductive layer 304 comprises tantalum. The second conductive layer 304 may be deposited by well-known methods such as electroplating, electroless plating, and sputtering.

Figure 3B:
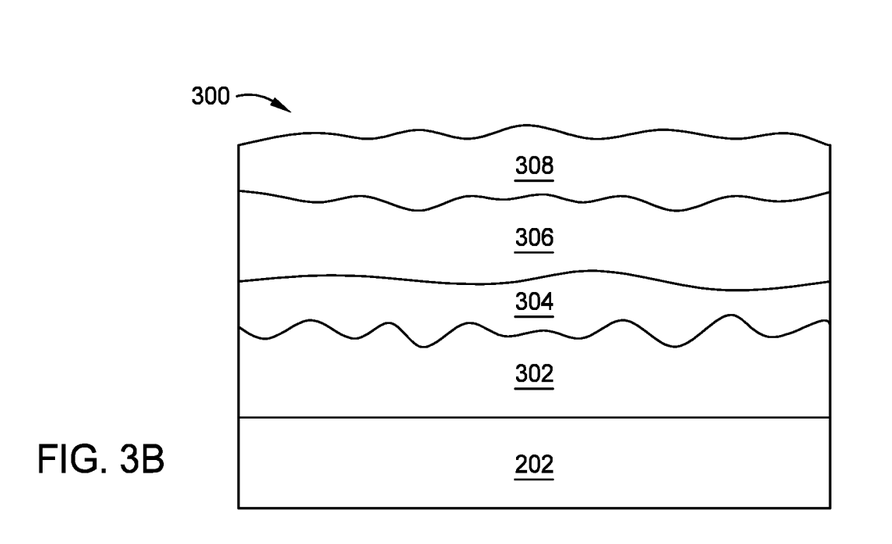
Figure 3C:
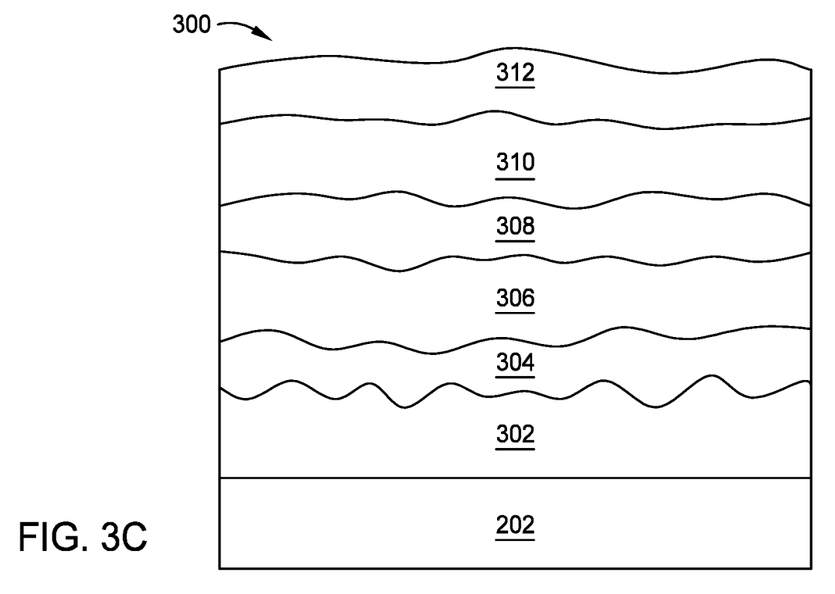

As shown in FIGS. 3B and 3C, additional first conductive layers 306, 310 are alternately deposited with additional second conductive layer 308, 312. The first conductive layers 302, 306, 310 are alternately deposited with the second conductive layers 304, 308, 312 until the desired thickness for the BL is achieved. With each successive layer of the first conductive layers 302, 306, 310 and the second conductive layers 304, 308, 312, the surface roughness is less than the previous respective conductive layer. However, it should be noted, that the surface roughness of the topmost layer is never less than or equal to 2 Angstroms absent additional processing beyond deposition. It should additionally be noted that while six total conductive layers have been shown, the disclosure is not limited to six total conductive layers, rather, any number of conductive layers is contemplated so long at the topmost conductive layer is the second conductive layer material and the total thickness is between about 20 nm to about 500 nm.

Figure 3D:
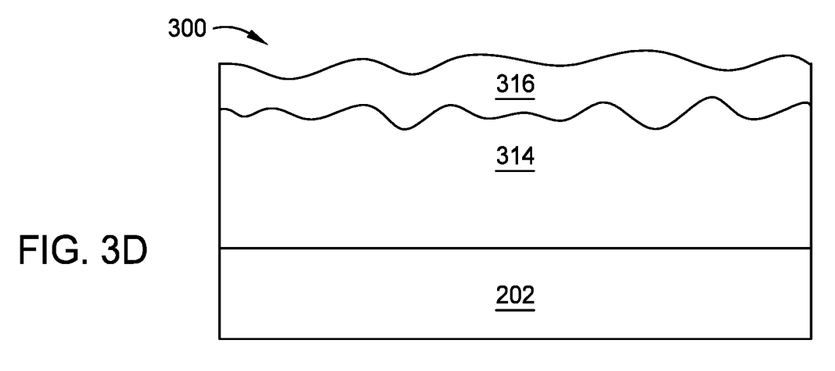
Figure 3E:
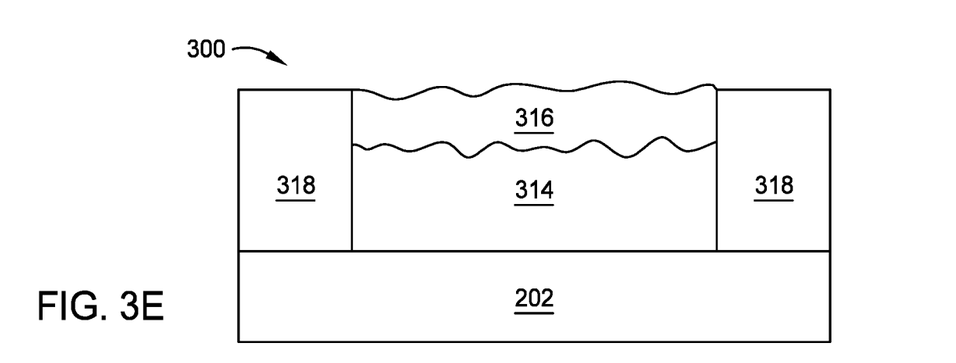

FIG. 3D illustrates the BL 300 where the alternating layers of first conductive layers and second conductive layers are collectively represented by layer 314 and have a surface roughness. The topmost layer 316, which will be a second conductive layer, is shown to have a surface roughness that is greater than 2 Angstroms. A mask is then formed over the topmost layer 316. In one embodiment, the mask is a photoresist mask formed by depositing a photoresist layer over the topmost layer 316, selectively exposing the photoresist, and then removing the exposed photoresist (or unexposed photoresist depending upon the type of photoresist used). The remaining photoresist functions as a mask to selectively cover portions of the BL 300. The exposed portions of the BL 300 are then removed by well-known removal techniques such as etching, to expose the substrate 202. An insulating material 318 is then deposited over the exposed substrate 202 as shown in FIG. 3E. In one embodiment, the insulating material 318 is the same as the topmost layer of the substrate 202. In another embodiment, the insulating material comprises aluminum oxide. It is to be understood that the embodiments discussed herein are not limited to aluminum oxide for the insulating material 318. The insulating material 318 may be deposited by well-known deposition methods such as chemical vapor deposition (CVD), atomic layer deposition (ALD), or plasma enhanced CVD (PECVD).

Figure 3F:
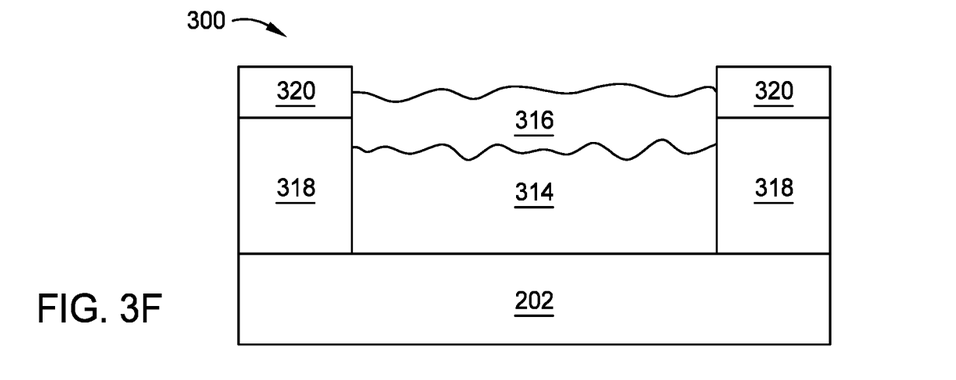
Figure 3G:
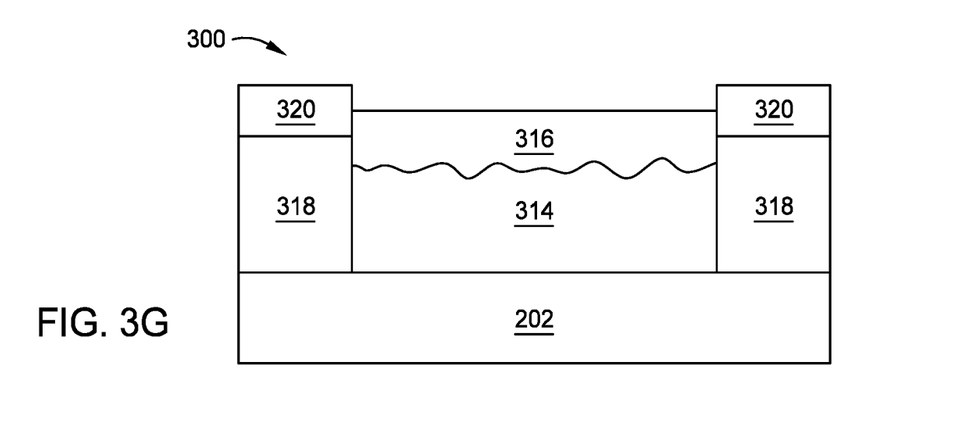

A CMP stop material 320 is then deposited on the insulating material 318 as shown in FIG. 3F. In one embodiment, the CMP stop material 320 comprises an insulating material. In another embodiment, the CMP stop material 320 comprises an insulating material that is different from the insulating material 318. In still another embodiment, the CMP stop material 320 comprises SiOx. The CMP stop material 320 may be deposited by well-known deposition methods such as CVD, ALD, or PECVD. The CMP stop material 320 will remove at a rate that is significantly slower than the topmost layer 316 during a CMP process and provide an indication that the CMP process is complete. As shown in FIG. 3G, a CMP process is performed to reduce the surface roughness of the topmost layer 316 while the CMP stop material 320 remains. In one embodiment, the topmost layer 316 surface roughness after the CMP process will be less than or equal to 2 Angstroms and the total material removed will be between about 2 nm to about 5 nm. In one embodiment, the CMP stop material 320 is removed in a separate process after the CMP process.

Figure 4A:
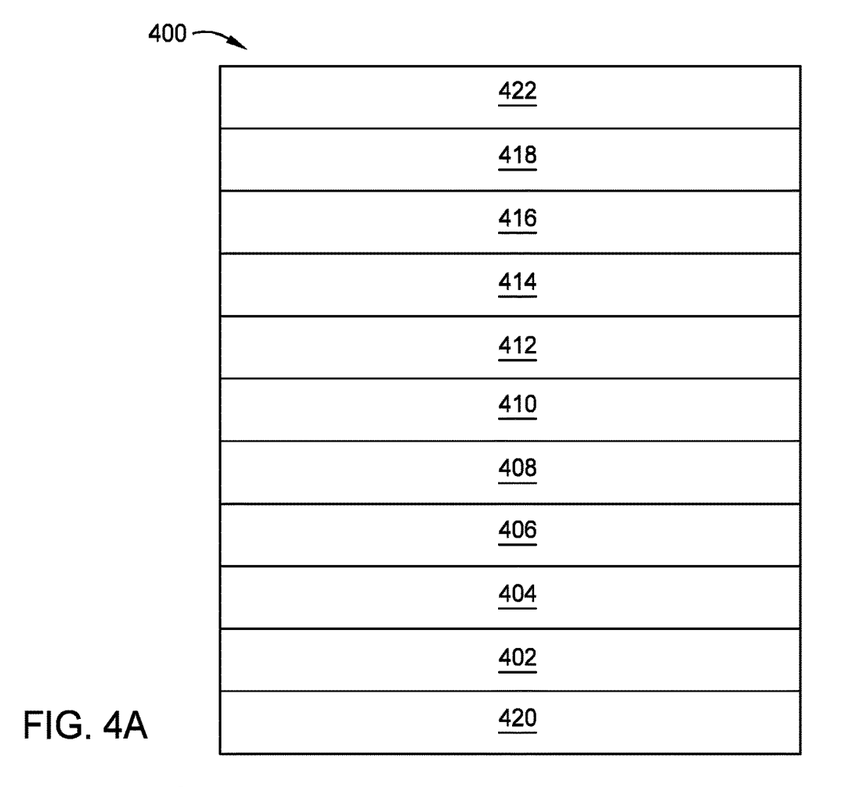
FIGS. 4A and 4B are schematic illustrations of TMR sensors for use in a Wheatstone bridge array according to one embodiment.
Figure 4B:
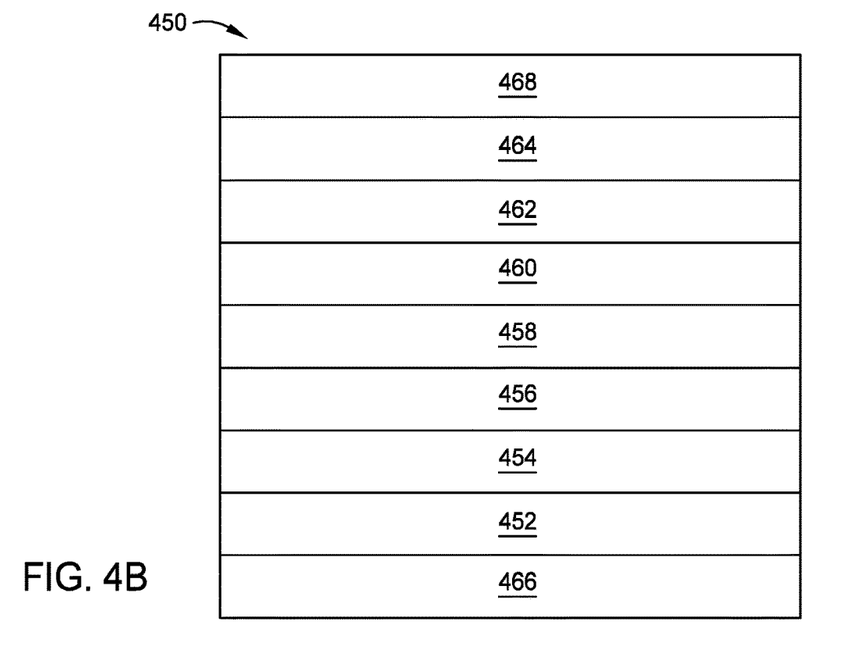

Now that the topmost layer 316 has a surface roughness of less than or equal to 2 Angstroms, the TMR films can be formed. FIGS. 4A and 4B are schematic illustrations of TMR sensors 400, 450 for use in a Wheatstone bridge array 100 according to one embodiment. FIG. 4A illustrates a first TMR sensor 400 and FIG. 4B illustrates a second TMR sensor 450.

In FIG. 4A, the TMR sensor 400 includes a BL 420 and a top lead 422. The BL 420 is fabricated as discussed above. The top lead 422 may be fabricated by the same process as the BL 420. In one embodiment, the top lead 422 may be fabricated by using a single conductive layer (e.g., copper) rather than a multilayer structure as the surface roughness for the top lead 422 does not impact the performance of the TMR sensor 400.

The TMR sensor 400 includes a seed layer 402 formed on the BL 420. In one embodiment, the seed layer 402 comprises a conductive material such as ruthenium and has a thickness of between about 10 Angstroms to about 100 Angstroms and is deposited by well-known deposition methods such as electroplating, electroless plating, or sputtering. Additionally, it is to be understood that while ruthenium has been exemplified as the seed layer 402 material, other materials are contemplated and the embodiments discussed herein are not limited to ruthenium for the seed layer 402.

An antiferromagnetic (AFM) layer 404 is disposed on the seed layer 404. Suitable materials for the AFM layer 404 include IrMn or PtMn at a thickness of between about 40 Angstroms to about 500 Angstroms. The AFM layer 404 may be formed by well-known deposition methods such as sputtering. Additionally, it is to be understood that while IrMn and PtMn have been exemplified as the AFM layer 404 materials, other materials are contemplated and the embodiments discussed herein are not limited to IrMn or PtMn for the AFM layer 404.

A pinned layer 406 is disposed on the AFM layer 404. Suitable materials for the pinner layer 406 include CoFe, or a Co/CoFe/Co multi-layer stack with a thickness of between about 20 Angstroms and about 30 Angstroms. The pinned layer 406 may be formed by well-known deposition methods such as sputtering. Additionally, it is to be understood that while CoFe or Co/CoFe/Co have been exemplified as the pinned layer 406 material, other materials are contemplated and the embodiments discussed herein are not limited to CoFe or Co/CoFe/Co for the pinned layer 406.

A spacer layer 408 is disposed on the pinned layer 406. Suitable materials for the spacer layer 408 includes Ru at a thickness of between about 4 Angstroms to about 10 Angstroms. The spacer layer 408 may be formed by well-known deposition methods such as sputtering. Additionally, it is to be understood that while ruthenium has been exemplified as the spacer layer 408 material, other materials are contemplated and the embodiments discussed herein are not limited to ruthenium for the spacer layer 408.

A reference layer 410 is disposed on the spacer layer 408. Suitable materials for the reference layer 410 include CoFe/Ta/CoFeB/CoFe as a multilayer stack. The CoFe layer may have a thickness of between about 8 Angstroms to about 10 Angstroms. The Ta layer may have a thickness of between about 0.5 Angstroms to about 2 Angstroms. The CoFeB layer may have a thickness of between about 10 Angstroms to about 15 Angstroms. The second CoFe layer may have a thickness of between about 3 Angstroms to about 10 Angstroms. The reference layer 410 may be formed by well-known deposition methods such as sputtering. Additionally, it is to be understood that while CoFe/Ta/CoFeB/CoFe has been exemplified as the reference layer 410 material, other materials are contemplated and the embodiments discussed herein are not limited to CoFe/Ta/CoFeB/CoFe for the reference layer 410.

A barrier layer 412 is disposed on the reference layer 410. Suitable material for the barrier layer 412 include MgO at a thickness of between about 10 Angstroms to about 20 Angstroms. It is to be understood that while MgO is exemplified as the barrier layer 412, other insulating materials as contemplated.

A first free layer 414 is disposed on the barrier layer 412. Suitable materials for the first free layer 414 include a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 300 Angstroms, such as between about 3 Angstroms and about 10 Angstroms or between about 10 Angstroms and about 300 Angstroms. The first free layer 414 may be formed by well-known deposition methods such as sputtering. Additionally, it is to be understood that while CoFe/CoFeB/Ta/NiFe has been exemplified as the first free layer 414 material, other materials are contemplated and the embodiments discussed herein are not limited to CoFe/CoFeB/Ta/NiFe for the first free layer 414.

Another spacer layer 416 is then formed on the first free layer 414. In one embodiment, the spacer layer 416 is a multilayer structure comprising Co/Ru/Co. It is to be understood that the spacer layer 416 may be a single layer or other multilayer stacks that comprise a first magnetic layer, a non-magnetic conductive layer, and a second magnetic layer. In the embodiment where the spacer layer 416 is Co/Ru/Co, the first Co layer can have a thickness of between about 3 Angstroms to about 6 Angstroms, the Ru layer can have a thickness of between about 6 Angstroms and about 10 Angstroms, and the second Co layer can have a thickness of between about 3 Angstroms to about 6 Angstroms. The Co layers are to enhance the synthetic antiferromagnetic (SAF) coupling. The spacer layer 416 may be formed by well-known deposition methods such as sputtering.

A second free layer 418 is then formed on the spacer layer 416. Suitable materials for the second free layer 418 include a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 300 Angstroms, such as between about 3 Angstroms and about 10 Angstroms or between about 10 Angstroms and about 300 Angstroms. The second free layer 418 may be formed by well-known deposition methods such as sputtering. Additionally, it is to be understood that while CoFe/CoFeB/Ta/NiFe has been exemplified as the second free layer 418 material, other materials are contemplated and the embodiments discussed herein are not limited to CoFe/CoFeB/Ta/NiFe for the second free layer 418.

FIG. 4B is a schematic illustration of a TMR sensor 450. In FIG. 4B, the TMR sensor 450 includes a BL 466 and a top lead 468. The BL 466 is fabricated as discussed above. The top lead 468 may be fabricated by the same process as the BL 466. In one embodiment, the top lead 468 may be fabricated by using a single conductive layer (e.g., copper) rather than a multilayer structure as the surface roughness for the top lead 468 does not impact the performance of the TMR sensor 450.

The TMR sensor 450 includes a seed layer 452. Suitable materials that may be used for the seed layer 452 include ruthenium at a thickness of between about 10 Angstroms and about 100 Angstroms. The seed layer 452 may be formed over a substrate (not shown). The substrate is understood to be any layer or layers that are present upon which the see layer 452 can be deposited. The seed layer 452 may be formed by well-known deposition methods such as sputtering. Additionally, it is to be understood that while ruthenium has been exemplified as the seed layer 452 material, other materials are contemplated and the embodiments discussed herein are not limited to ruthenium for the seed layer 452.

An AFM layer 454 is disposed on the seed layer 452. Suitable materials for the AFM layer 454 include IrMn or PtMn at a thickness of between about 40 Angstroms to about 500 Angstroms. The AFM layer 454 may be formed by well-known deposition methods such as sputtering. Additionally, it is to be understood that while IrMn and PtMn have been exemplified as the AFM layer 454 materials, other materials are contemplated and the embodiments discussed herein are not limited to IrMn or PtMn for the AFM layer 454.

A pinned layer 456 is disposed on the AFM layer 454. Suitable materials for the pinner layer 456 include CoFe, or a Co/CoFe/Co multi-layer stack with a thickness of between about 20 Angstroms and about 30 Angstroms. The pinned layer 456 may be formed by well-known deposition methods such as sputtering. Additionally, it is to be understood that while CoFe or Co/CoFe/Co have been exemplified as the pinned layer 456 material, other materials are contemplated and the embodiments discussed herein are not limited to CoFe or Co/CoFe/Co for the pinned layer 456.

A spacer layer 458 is disposed on the pinned layer 458. Suitable materials for the spacer layer 458 includes ruthenium at a thickness of between about 4 Angstroms to about 10 Angstroms. The spacer layer 458 may be formed by well-known deposition methods such as sputtering. Additionally, it is to be understood that while ruthenium has been exemplified as the spacer layer 458 material, other materials are contemplated and the embodiments discussed herein are not limited to ruthenium for the spacer layer 458.

A reference layer 460 is disposed on the spacer layer 458. Suitable materials for the reference layer 460 include CoFe/Ta/CoFeB/CoFe as a multilayer stack. The CoFe layer may have a thickness of between about 8 Angstroms to about 10 Angstroms. The Ta layer may have a thickness of between about 0.5 Angstroms to about 2 Angstroms. The CoFeB layer may have a thickness of between about 10 Angstroms to about 15 Angstroms. The second CoFe layer may have a thickness of between about 3 Angstroms to about 10 Angstroms. The reference layer 460 may be formed by well-known deposition methods such as sputtering. Additionally, it is to be understood that while CoFe/Ta/CoFeB/CoFe has been exemplified as the reference layer 460 material, other materials are contemplated and the embodiments discussed herein are not limited to CoFe/Ta/CoFeB/CoFe for the reference layer 460.

A barrier layer 462 is disposed on the reference layer 460. Suitable material for the barrier layer 462 include MgO at a thickness of between about 10 Angstroms to about 20 Angstroms. It is to be understood that while MgO is exemplified as the barrier layer 462, other insulating materials as contemplated.

A free layer 464 is disposed on the barrier layer 462. Suitable materials for the free layer 464 include a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 300 Angstroms, such as between about 3 Angstroms and about 10 Angstroms or between about 10 Angstroms and about 300 Angstroms. The free layer 464 may be formed by well-known deposition methods such as sputtering. Additionally, it is to be understood that while CoFe/CoFeB/Ta/NiFe has been exemplified as the free layer 464 material, other materials are contemplated and the embodiments discussed herein are not limited to CoFe/CoFeB/Ta/NiFe for the free layer 464.

After the TMR sensors 400, 450 have been formed as a TMR stack, the stack is annealed in a magnetic oven at a temperature of between about 250 degrees Celsius and about 300 degrees Celsius under a magnetic field of between about 10,000 Oe to about 50,000 Oe.

Figure 5:
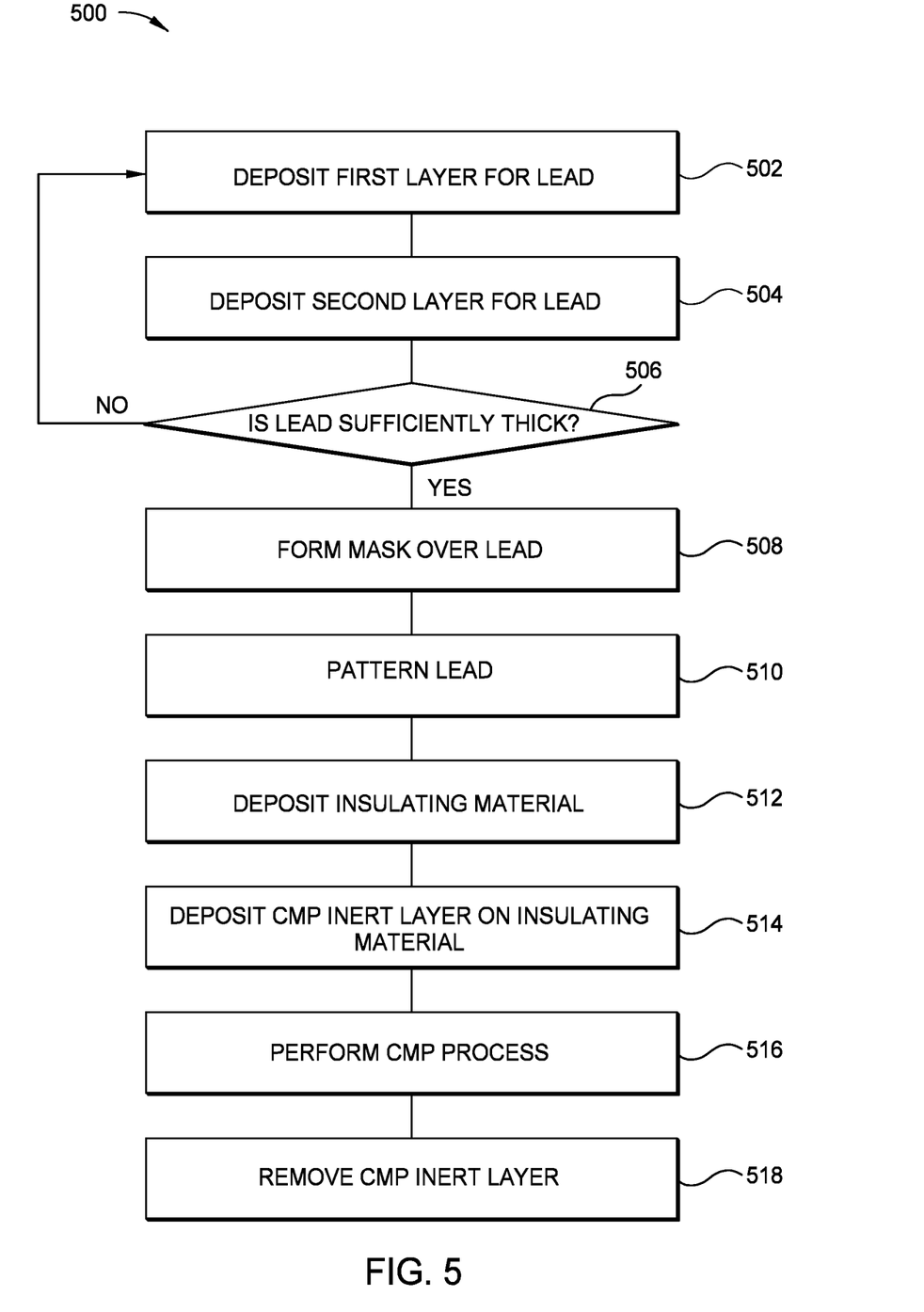
FIG. 5 is a flowchart illustrating a method of fabricating a bottom lead for a TMR sensor of a Wheatstone bridge array.

FIG. 5 is a flowchart illustrating a method 500 of fabricating a BL for a TMR sensor of a Wheatstone bridge array. In step 502, the first layer for the BL is deposited. The first layer corresponds to the first conductive layer 302 discussed above. Then, in step 504, the second layer for the BL is deposited. The second layer corresponds to the second conductive layer 304 discussed above. Thereafter, a determination is made in step 506 regarding whether the thickness of the BL (i.e., the collective thickness of the first layer and the second layer) is sufficiently thick. If the thickness is not sufficiently thick, both steps 502 and 504 are repeated until the desired thickness is achieved. If the BL is sufficiently thick, a mask is formed over the BL in step 508. The BL is then patterned in step 510. Insulating material is deposited adjacent to the BL in step 512. CMP stop material is then deposited over the insulating material in step 514. A CMP process is then performed in step 516 to reduce the surface roughness of the topmost layer of the BL. Finally, the CMP stop material, which may be referred to as a CMP inert layer, is optionally removed in step 518.

In one embodiment, a TMR sensor device comprises: a substrate; a bottom lead disposed over the substrate, the bottom lead formed by a chemical mechanical polishing (CMP) process; a tunneling magnetic resistive (TMR) sensor stack coupled to the bottom lead; and a top lead coupled to the TMR sensor stack. The bottom lead has a surface roughness less than or equal to 2 Angstroms. The bottom lead comprises alternating conductive layers that have different surface roughnesses. The alternating conductive layers comprise different materials. At least one conductive layer is amorphous. A first layer of the alternating conductive layers comprises copper and a second layer of the alternating conductive layers comprises tantalum. A CMP stop layer is disposed adjacent a top surface of the bottom lead. The bottom lead has a surface roughness that translates through the TMR sensor stack.

In another embodiment, a method of fabricating a TMR sensor device comprises: forming a bottom lead over a substrate, wherein the forming includes: depositing a first conductive material over a substrate; depositing a second conductive material on the first conductive material, wherein the first conductive material and the second conductive material are different; depositing a photoresist layer over the bottom lead; selectively removing a portion of the bottom lead; depositing an electrically insulating material adjacent remaining bottom lead; depositing a chemical mechanical polishing (CMP) stop layer on the electrically insulating material; performing a CMP process on the bottom lead; forming a tunneling magnetic resistive (TMR) sensor stack over the bottom lead; and forming a top lead over the TMR sensor stack. The CMP process reduces a surface roughness of a top layer of the bottom lead to less than or equal to 2 Angstroms. The CMP stop layer comprises SiOx. The CMP stop layer and the electrically insulating material comprise different materials. Forming the bottom lead comprises repeating the depositing the first conductive material and depositing the second conductive material at least one time. The first conductive material has a greater thickness than the second conductive material. An uppermost second conductive film has a thickness of between about 10-13 nm after the CMP process.

In another embodiment, a method for manufacturing a bottom lead comprises: depositing alternating layers of conductive material onto a substrate to create a bottom lead stack; depositing a layer of a CMP-inert metal film on top of the bottom lead stack; depositing an outer insulating material around the bottom lead stack; depositing a CMP stopper layer on top of the outer insulating material; and performing a CMP process on the CMP-inert metal film using a polishing slurry. The alternating layers of conductive material are copper and tantalum. The CMP-inert metal film is tantalum. The CMP-inert metal film has a thickness of 10-15 nm prior to performing the CMP process. The outer insulating material comprises aluminum oxide. The CMP stopper layer is a silicon oxide. The CMP process removes less than 5 nm of the CMP-inert metal film. The CMP-inert metal film has a surface roughness of 2 Angstroms or less after application of the CMP process.

In one embodiment, the TMR sensor is used in a camera operating as a single axis sensor. An example of such a sensor is found in United States Patent Application Publication No.: 2019/0020822 A1, which is incorporated herein by reference. However, it is contemplated that the TMR sensor may be utilized as a two dimensional or even a three dimensional sensor. Additionally, it is contemplated that TMR sensor may be integrated and utilized in inertial measurement unit technologies other than cameras such as wearable devices, compasses, and MEMS devices. Furthermore, the TMR sensor may operate as a position sensor, a bridge angular sensor, a magnetic switch, a current sensor, or combinations thereof. The TMR sensor may be used to focus a camera such as a smart phone camera by using the TMR sensors as position and angular sensors. Also, TMR sensors have applicability in the automotive industry as switch, current, and angular sensors to replace current Hall, anisotropic magnetoresistance (AMR) and giant magnetoresistance (GMR) sensors. TMR sensors may also be used in the drones and robotics industry as position and angular sensors. Medical devices can also utilize TMR sensors for flow rate control for infusion systems and endoscope camera sensors among others. Thus, the TMR sensors discussed herein have applications well beyond smart phone cameras and thus should not be limited to use as sensors for smart phone cameras. Furthermore, TMR sensors need not be arranged in a Wheatstone bridge arrangement, but rather, may be arranged in any number of manners.

By using multiple layers for the bottom lead, as well as performing a CMP process on the topmost layer of the bottom lead, a surface roughness of 2 Angstroms or less can be achieved. The very low surface roughness for the bottom lead results in improved performance and magnetoresistance response such that a Wheatstone bridge array has improved functionality.

While the foregoing is directed to embodiments of the present disclosure, other and further embodiments of the disclosure may be devised without departing from the basic scope thereof, and the scope thereof is determined by the claims that follow.

What is claimed is:

1. A tunnel magnetoresistive (TMR) sensor device, comprising:
   a substrate;
   a bottom lead disposed over the substrate, the bottom lead formed by a chemical mechanical planarizing (CMP) process, wherein the bottom lead comprises alternating conductive layers that have different physical characteristics or different material compositions, at least one conductive layer being amorphous;
   a TMR sensor stack coupled to the bottom lead; and
   a top lead coupled to the TMR sensor stack.

2. The TMR sensor device of claim 1, wherein the bottom lead has a surface roughness less than or equal to 2 Angstroms.

3. The TMR sensor device of claim 1, wherein the alternating conductive layers have different surface roughnesses.

4. The TMR sensor device of claim 3, wherein the alternating conductive layers comprise different materials.

5. The TMR sensor device of claim 1, wherein a first layer of the alternating conductive layers comprises copper and a second layer of the alternating conductive layers comprises tantalum.

6. The TMR sensor device of claim 1, further comprising a CMP stop layer disposed adjacent a top surface of the bottom lead.

7. The TMR sensor device of claim 1, wherein the bottom lead has a surface roughness that translates through the TMR sensor stack.

8. A method of fabricating a TMR sensor device, comprising:
   forming a bottom lead over a substrate, wherein the forming includes:
     depositing a first conductive material over a substrate;
     depositing a second conductive material on the first conductive material,
     wherein the first conductive material and the second conductive material are different;
   depositing a photoresist layer over the bottom lead;
   selectively removing a portion of the bottom lead;
   depositing an electrically insulating material adjacent remaining bottom lead;
   depositing a CMP stop layer on the electrically insulating material;
   performing a CMP process on the bottom lead;
   forming a TMR sensor stack over the bottom lead; and
   forming a top lead over the TMR sensor stack.

9. The method of claim 8, wherein the CMP process reduces a surface roughness of a top layer of the bottom lead to less than or equal to 2 Angstroms.

10. The method of claim 8, wherein the CMP stop layer comprises SiOx.

11. The method of claim 8, wherein the CMP stop layer and the electrically insulating material comprise different materials.

12. The method of claim 8, wherein forming the bottom lead comprises repeating the depositing the first conductive material and depositing the second conductive material at least one time.

13. The method of claim 8, wherein the first conductive material has a greater thickness than the second conductive material.

14. The method of claim 8, wherein an uppermost second conductive film has a thickness of between about 10-13 nm after the CMP process.

15. A method for manufacturing a bottom lead, comprising:
    depositing alternating layers of conductive material onto a substrate to create a bottom lead stack;
    depositing a layer of a CMP-inert metal film on top of the bottom lead stack;
    depositing an outer insulating material around the bottom lead stack;
    depositing a CMP stopper layer on top of the outer insulating material, wherein the CMP stopper layer is a silicon oxide; and
    performing a CMP process on the CMP-inert metal film using a polishing slurry.

16. The method of claim 15, wherein the alternating layers of conductive material are copper and tantalum.

17. The method of claim 15, wherein the CMP-inert metal film is tantalum.

18. The method of claim 15, wherein the CMP-inert metal film has a thickness of 10-15 nm prior to performing the CMP process.

19. The method of claim 15, wherein the outer insulating material comprises aluminum oxide.

20. The method of claim 15, wherein the CMP process removes less than 5 nm of the CMP-inert metal film.

21. The method of claim 15, wherein the CMP-inert metal film has a surface roughness of 2 Angstroms or less after application of the CMP process.

22. A method for manufacturing a bottom lead, comprising:
    depositing alternating layers of conductive material onto a substrate to create a bottom lead stack;
    depositing a layer of a CMP-inert metal film on top of the bottom lead stack;
    depositing an outer insulating material around the bottom lead stack;
    depositing a CMP stopper layer on top of the outer insulating material; and
    performing a CMP process on the CMP-inert metal film using a polishing slurry, wherein the CMP process removes less than 5 nm of the CMP-inert metal film.

* * * * *